United States Patent [19]
Leigh et al.

[11] Patent Number: 5,963,779
[45] Date of Patent: Oct. 5, 1999

[54] INTEGRATED CIRCUIT USING A BACK GATE VOLTAGE FOR BURN-IN OPERATIONS

[75] Inventors: Anthony W. Leigh, Richmond; Joe W. McPherson; Kenan J. Dickerson, both of Plano, all of Tex.

[73] Assignee: Texas Instruments Incorporated, Dallas, Tex.

[21] Appl. No.: 09/211,606

[22] Filed: Dec. 15, 1998

Related U.S. Application Data

[60] Provisional application No. 60/068,679, Dec. 24, 1997.

[51] Int. Cl.$^6$ .................................................. H01L 21/00
[52] U.S. Cl. ............................................................ 438/11
[58] Field of Search ..................... 438/11, 5, 19, 438/128; 365/189.09

[56] References Cited

U.S. PATENT DOCUMENTS

| | | | |
|---|---|---|---|
| 5,528,538 | 6/1996 | Sakura et al. | 365/189.09 |
| 5,633,825 | 5/1997 | Sakura et al. | 365/189.09 |

*Primary Examiner*—Charles Bowers
*Assistant Examiner*—Craig Thompson
*Attorney, Agent, or Firm*—Robert D. Marshall, Jr.; Gerald E. Laws; Richard L. Donaldson

[57] ABSTRACT

Integrated circuit architectures and methods of operation are provided that allow for the connection of a negative back-gate bias voltage to substrate contacts 24, 90, and 56 during burn-in operations. Accordingly, latch up conditions are prevented during burn-in operations when a circuit is especially vulnerable to such conditions and a grounded substrate is provided to allow for the most efficient operation of the circuit during normal conditions.

7 Claims, 2 Drawing Sheets

INTEGRATED CIRCUIT USING A BACK GATE VOLTAGE FOR BURN-IN OPERATIONS

This application claims priority under 35 USC §119(e)(1) of provisional application Ser. No. 60/068,679, filed Dec. 24, 1997.

TECHNICAL FIELD OF THE INVENTION

This invention relates in general to the field of electronic devices and, more particularly, to an integrated circuit utilizing a back-gate bias voltage during burn-in operations.

BACKGROUND OF THE INVENTION

Designers of integrated circuits constantly strive to make the devices smaller so that more active devices can be placed on a single integrated circuit and so that the integrated circuit will have a lower cost. As devices become smaller, it becomes increasingly more difficult to prevent the formation of parasitic devices. One example of a parasitic device is the formation of a parasitic bipolar transistor between the source and drain of a field effect transistor with the bulk substrate being the remaining terminal of the bipolar transistor. In CMOS architectures, adjoining field effect devices can both create parasitic bipolar transistors in such a manner that a parasitic silicon controlled rectifier is formed. This condition is referred to as latch up and can destroy the normal operation of the CMOS system.

After an integrated circuit has been completed, the system is often tested using a burn-in process. During thus burn-in process, a higher than normal voltage is applied to the terminals which act as supply voltages within the: circuit. The circuit is then exercised at the higher than normal operating voltage. If the device is susceptible to failure, the burn-in process can cause such failures to occur to isolate and eliminate the susceptible devices. For example, burn-in is a useful way of eliminating devices that have defective gate oxides formed within field effect: transistors. Because of the higher voltages used during burn-in, an integrated circuit is ordinarily much more susceptible to both formation of unwanted parasitic devices and in some cases, latch up of the device.

Prior systems have attempted to address the latch up problem by placing a negative voltage on the substrate of the integrated circuit. This back-gate bias voltage makes it more difficult to forward bias the base emitter junction of a parasitic bipolar transistor and, thus, helps to prevent the latch up condition. However, a negative substrate bias can reduce the operating efficiency of the integrated circuit during normal operations after burn-in processing is complete.

SUMMARY OF THE INVENTION

Accordingly, a need has arisen for an integrated circuit that is substantially resistant to the latch up condition in both normal operation and during the burn-in cycle, but which does not suffer the reductions in operating efficiencies associated with back-gate bias voltages during normal operation.

In accordance with the teachings of the present invention, an integrated circuit architecture is provided that substantially eliminates or reduces problems associated with prior systems and methods of operation.

According to one embodiment of the present invention, an integrated circuit architecture is provided that comprises a field effect transistor formed in an outer is surface of semiconductor layer. A substrate contact is provided to allow a negative back-gate bias voltage to be applied during burn-in operations. A ground conductor is connected to at least some of the terminals of the active devices within the integrated circuit. During normal operations, substrate contact can be electrically connected to the ground conductor.

According to an alternate embodiment of the present invention, a method for testing an integrated circuit is provided that comprises the steps of forming an integrated circuit on a semiconductor substrate. The integrated circuit is formed to include a ground potential conductive network and conductive contact to the semiconductor substrate. The integrated circuit is subjected to a burnin operation by connecting a supply voltage to the integrated circuit that is substantially higher than the supply voltage used in normal operation. During the burnin operation, the contact to the semiconductor substrate is connected to a negative supply voltage to provide for a negative back-gate bias voltage. During normal operations of the bias, the substrate contact is electrically connected to the ground potential conductive network.

An important technical advantage of the present invention inheres in the fact that an integrated circuit architecture is provided that allows for the use of a negative back-gate bias voltage during burn-in operations of the device but allows for a grounded substrate during normal operation of the device. In this manner, latch up condition can be prevented during burn-in operations when the integrated circuit is especially susceptible to the latch up condition. In contrast, during normal operations of the device, a grounded substrate can be used to ensure maximum operational efficiency of the integrated circuit.

BRIEF DESCRIPTION OF THE DRAWINGS

A more complete understanding of the present invention and the advantage thereof may be acquired by referring to the accompanying figures in which like reference numbers indicate like features and wherein.

DETAILED DESCRIPTION OF THE INVENTION

Figure 1:
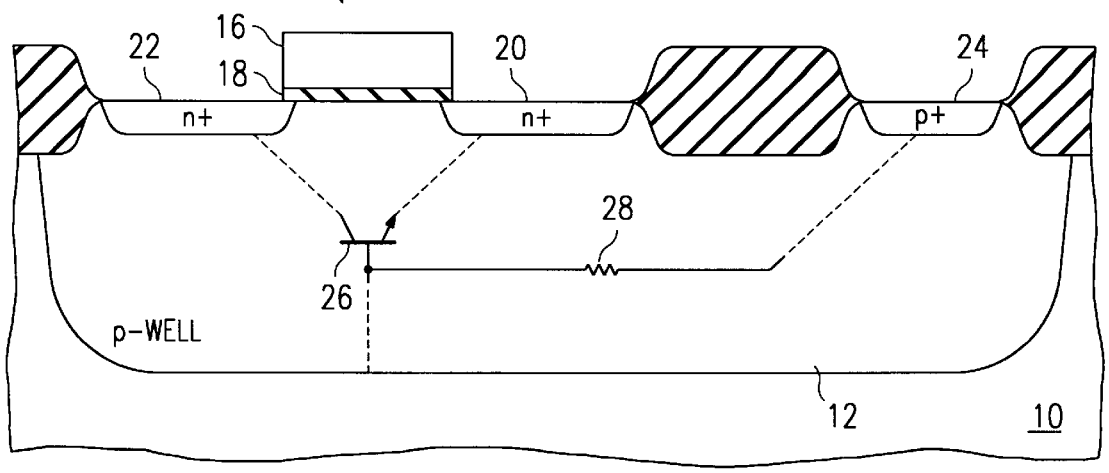
FIG. 1 is a greatly enlarged cross-sectional, elevational schematic diagram of a field effect transistor that may comprise a portion of an integrated circuit constructed according to teachings of the present invention.

FIG. 1 is a cross-sectional diagram which illustrates a portion of an integrated circuit formed on a semiconductor substrate 10. A p-well 12 is formed in an outer surface of the semiconductor substrate 10. P-well 12 contains an n-channel field effect transistor indicated generally at 14. Transistor 14 comprises a gate conductor 16 separated from the outer surface of the semiconductor substrate 10 by a gate insulator layer 18. On opposite sides of gate conductor 16 are formed a source region 20 and a drain region 22. Source and drain regions 20 and 22 comprise regions of p-well 12 that have been doped with n-type impurities. In contrast, a substrate contact region 24 is formed proximate transistor 14 within p-well 12. Contact region 24 comprises a region of p-well 12 that has been doped with additional p-type impurities. Contact 24 can be used to electrically contact p-well 12 and the bulk of substrate 10.

In the exemplary circuit shown in FIG. 1, substrate 10 comprises a p-type substrate. For example, substrate 10 may comprise a substrate construction using epitaxial methods that has a resistivity on the order of 0.01 to 0.03 Ω·cm. Alternatively, substrate 10 may comprise a non-epitaxial substrate that has a resistivity on the order of 10 to 15 Ω·cm. As will be discussed more completely herein, the resistivity of the substrate is an important consideration in how the back-gate bias voltage of the present invention is applied. If the resistivity is low enough as in the example of an epitaxially-created substrate, few contacts to the substrate such as contact 24 are necessary. If on the other hand, the resistivity of the substrate is higher, as in the case of a non-epitaxial substrate, more contacts to the substrate such as contact region 24 are necessary in order to maintain the consistent and evenly dispersed back-gate bias voltage necessary to prevent the latch up condition.

FIG. 1 also schematically illustrates the presence of a parasitic npn bipolar transistor 26 and a parasitic resistor 28. The emitter of parasitic transistor 26 corresponds to the source region 20 of transistor 14. Similarly, the collector of transistor 26 corresponds to the drain region 22 of transistor 14. The base of transistor 26 corresponds to the substrate 10 and the p-well 12. The inherent resistance of the p-well 12 provides the resistance between the base of transistor 26 and the substrate contact 24.

A complimentary parasitic pnp transistor to parasitic transistor 26 can be formed in an n-well adjacent to p-well 12 if a p-channel device is present in that n-well. The combination of the pnp transistor formed in the adjacent n-well and transistor 26 can create a parasitic silicon controlled rectifier that can, if triggered, create a latch up condition that can destroy the operation of the integrated circuit including transistor 14. In order for latch up to occur, transistor 26 must have a forward biased base emitter junction. In the context of transistor 14, this condition occurs when the substrate 10 and the p-well 12 are at a higher voltage than the source region 20. Accordingly, this condition can be prevented by applying a negative voltage to the substrate 10 and to the p-well 12 through contact region 24. By applying such a back-gate bias voltage, the base emitter junction of parasitic transistor 26 cannot become forward biased until the negative magnitude of the back-gate bias voltage is overcome.

Figure 2:
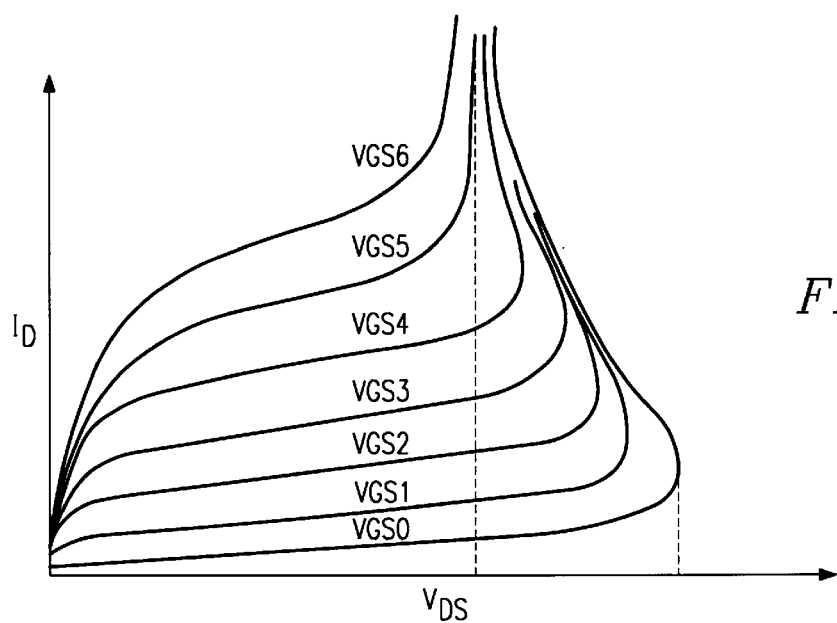
FIG. 2 is a graphical depiction of the transfer characteristics of the transistor shown in FIG. 1.

The effect of parasitic transistor 26 on the operation of transistor 14 can be seen dramatically in the graphical illustration of FIG. 2. FIG. 2 is a graph which plots the drain current, $I_D$, versus the drain source voltage, $V_{DS}$, over a number of gate source voltages, $V_{GS1}$. As can be seen in FIG. 2, for each value of the gate source voltage, the drain current slowly increases as the drain source voltage is increased. This smooth increase occurs until a sharp elbow is reached at the right side of each curve. This elbow results from the operation of impact ionization creating a higher voltage within the p-well 12. This higher voltage forward biases the base emitter junction of transistor 26 and causes a rapid increase in the current flowing from source 20. It can be seen clearly from the transfer characteristic shown in FIG. 2 that the higher the gate source voltage and the drain source voltage, the easier it is to reach the breakdown portion of the transfer curve. As such, during burn-in operations of transistor 14, it is much more likely that a latch up condition will occur. This is due to the fact that during burn-in operations, the supply voltages of the integrated circuit containing transistor 14 are typically set at up to 50% higher than normal operational voltages. For example, in a circuit that typically uses a 2.5 supply voltage, $V_{DD}$, the burn-in supply voltage might be as high as 3.7 to 4.0 volts. This higher supply voltage causes both the drain source voltage and the gate source voltage of transistor 14 to increase proportionately. This has the effect of moving the zone operation of transistor 14 up and to the right of the transfer curve shown in FIG. 2. This movement in the transfer curve will make the transistor operate in a region where latch up is much more likely to occur.

By applying a negative voltage to the substrate contact 24, the transfer characteristic shown in FIG. 2 is effectively shifted up and to the right. If the resistance of the p-well 12 is low, the applied back-gate bias voltage can have a dramatic effect on preventing latch up condition. For example, a negative back-gate bias voltage having a magnitude of one or two volts during burn-pocket in operations of the device can effectively prevent latch, up condition from occurring.

It can be disadvantageous, however, to use a negative back-gate bias during normal operation of the device. A grounded substrate can provide for more efficient operating conditions for transistor 14 and other devices within the integrated circuit in which transistor 14 resides. As such, the present invention provides a circuit and method for providing a negative back-gate bias voltage during burn-in operations but providing for a grounded substrate during normal operations of an integrated circuit.

Figure 3:
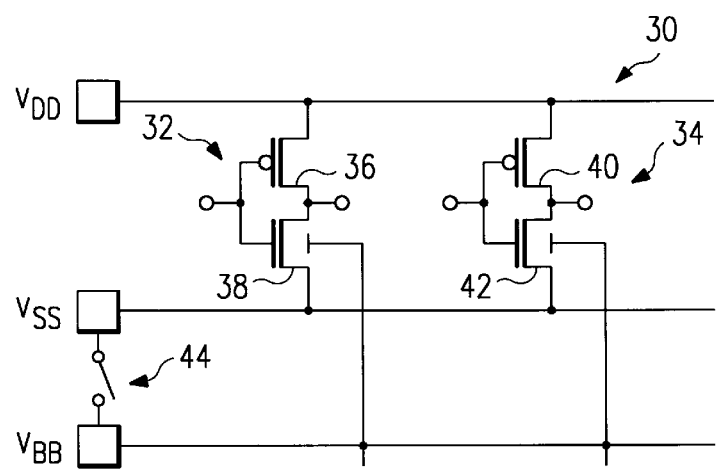
FIG. 3 is a schematic diagram of a portion of an integrated circuit constructed according to the teachings of the present invention.

Referring to FIG. 3, an exemplary integrated circuit indicated generally at 30 is shown in schematic form. Circuit 30 comprises an inverter 32 and an inverter 34. Inverter 32 comprises a p-channel transistor 36 and an n-channel transistor 38. Inverter 34 comprises a p-channel transistor 40 and an n-channel transistor 42. Transistors 36 and 38 have their gates connected to one another and their drains connected to one another. Transistors 40 and 42 have their gates connected to one another and their drains connected to one another. Transistor 36 has its source connected to the $V_{DD}$ supply voltage. Transistor 38 has its source connected to the $V_{SS}$ supply voltage. Similarly, transistor 40 has its source connected to the $V_{DD}$ supply voltage. Transistor 42 has its source connected to the $V_{SS}$ supply voltage.

A back-gate contact to n-channel transistor 38 is connected to the $V_{BB}$ supply voltage. A back-gate contact of n-channel transistor 42 is also connected to the $V_{BB}$ supply voltage. In a typical circuit, the $V_{SS}$ supply voltage will be on the order of 2.5 volts. The $V_{SS}$ supply voltage will be ground potential and the $V_{BB}$ supply voltage might be on the order of −2 volts. A mechanism symbolically illustrated by switch 44 is provided to electrically connect the $V_{SS}$ conductive network to the $V_{BB}$ conductive network. During burn-in operations, switch 44 is open and the $V_{BB}$ conductive network is set at −2 volts. During normal operations, the $V_{BB}$ conductive network is disconnected from the −2 volts supply and switch 44 is closed so that the $V_{BB}$ is set at ground potential. In this manner, latch up of the inverters 32 and 34 is prevented during the burn-in operations where circuit 30 is especially susceptible to latch up. In contrast, during normal operations, the substrate on which circuit 30 is formed is connected to ground potential to provide for the most efficient operation of circuit 30.

Figure 4:
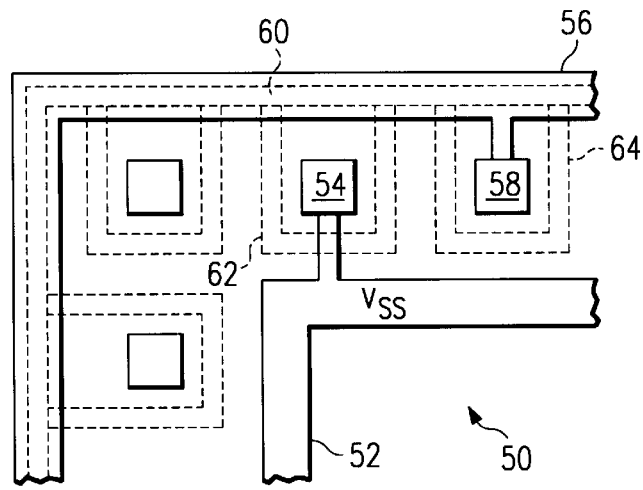
FIG. 4 is a greatly enlarged planar diagram of a portion of an integrated circuit constructed according to one embodiment of the present invention.

FIG. 4 illustrates a method that can be used to provide for contact to the substrate of an integrated circuit such that a back-gate bias voltage can be applied if the substrate has a sufficiently low resistivity. FIG. 4 illustrates a portion of the periphery of an integrated circuit indicated generally at 50. Circuit 50 includes a conductive network 52 which is connected to the $V_{SS}$ voltage level. The $V_{SS}$ voltage level is typically ground potential as discussed previously. Conductive network 52 is electrically connected to a bond pad 54. A scribe seal conductive network 56 surrounds the periphery of the chip. The scribe seal conductive network can be electrically connected to a bond pad 58. Disposed inwardly from the scribe seal conductive network 56 is a diffused region 60. If circuit 50 is formed on a p-type substrate such as substrate 10 discussed previously, diffused region 60 may comprise a region of the surfaces of the substrate which has been implanted with additional p-type impurities. Region 60 would be similar to substrate contact 24 discussed with reference to FIG. 1 previously. Region 60 also includes guard ring extensions which surround the bond pads such as extension 62 surrounding bond pad 54 and extension 64 surrounding bond pad 58. When circuit 50 is placed in an integrated circuit package, bonding wires and external pins are connected to bond pads 54 and 58. In this manner, the $V_{SS}$ conductive network 52 is connected to an external pin such that ground potential can be applied to the conductive network 52. Similarly, bond pad 58 is connected to an external pin such that the substrate on which circuit 50 is formed can be connected to either a negative back-gate bias voltage during burn-in operations or to ground potential during normal operations. If the substrate on which circuit 50 is formed has a sufficiently low resistivity, the scribe seal network 56 and the diffused region 60 will provide sufficient electrical contact to maintain a consistent voltage level of the substrate throughout the integrated circuit.

Figure 5:
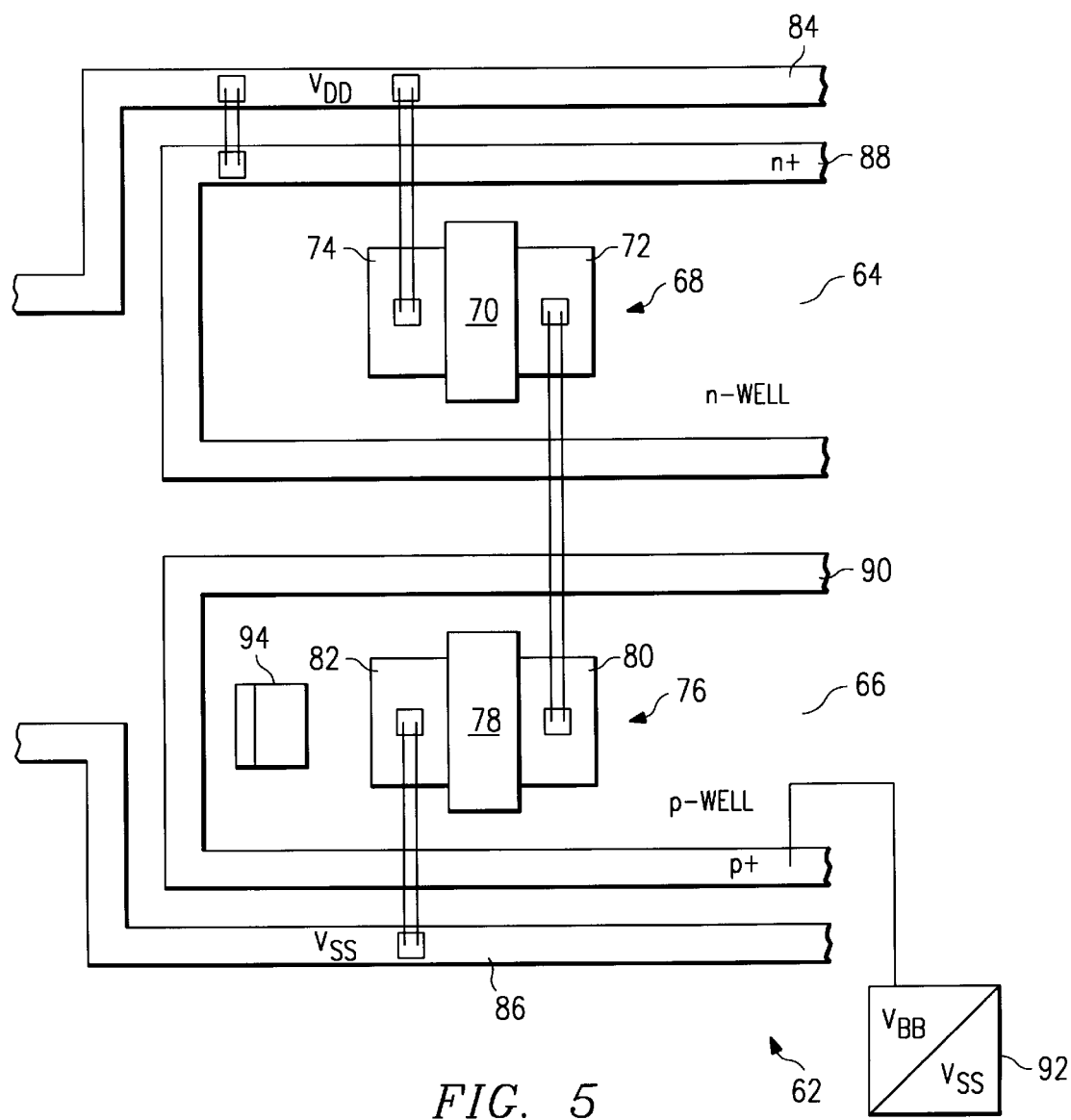
FIG. 5 is a greatly enlarged planar diagram of one portion of an integrated circuit constructed according to one embodiment of the present invention.

FIG. 5 illustrates an alternative embodiment of the present invention that may be used when a semiconductor substrate does not have a sufficient resistivity and additional substrate contacts such as contact 24 discussed with reference to FIG. 1 are necessary. FIG. 5 illustrates a portion of an integrated circuit indicated generally at 62. Circuit 62 is formed on the outer surface of a semiconductor substrate. An n-well 64 and a p-well 66 are formed in the outer surface of the substrate. A p-channel transistor indicated generally at 68 is formed in n-well 64. Transistor 68 includes a gate conductor 70, a drain region 72, and a source region 74. Similarly, an n-channel field effect transistor indicated generally at 76 is formed in p-well 66. Transistor 76 comprises a gate conductor 78, a drain region 80 and a source region 82. The combination of transistor 68 and transistor 76 may be configured to form an inverter similar to inverters 32 and 34 discussed with reference to FIG. 3 previously. In this configuration, the source of transistor 74 is electrically connected to a $V_{DD}$ conductive network 84. Similarly, the source region 82 of transistor 76 is electrically connected to a $V_{SS}$ conductive network 86.

A guard ring 88 surrounds the periphery of n-well 64. Guard ring 88 may comprise a region of the outer surface of the substrate that has been doped with additional n-type impurities. Guard ring 88 is typically electrically connected to the $V_{DD}$ conductive network 84.

In contrast, a guard ring 90 surrounds p-well region 66. Guard ring 90 may comprise a region of the outer surface of the substrate that has been implanted with additional p-type impurities. Guard ring 90 is electrically connected to a bond pad 92 which is connected to a negative back-gate bias voltage $V_{SS}$ during burn-in operations and is connected to the $V_{SS}$ supply voltage during normal operations. Alternatively, a substrate contact 94 can be disposed proximate transistor 76 to provide contact to the substrate in which transistor 76 and p-well 66 are formed. In any event, through the use of a guard ring such as guard ring 90, or through the use of multiple substrate contacts such as contact 94, the devices such as transistor 76 cannot be spaced too far away from a substrate contact. Typically, in order to prevent latch up from occurring, active devices should not be placed further than on the order of 10–15 microns from a substrate contact.

Accordingly, an integrated circuit architecture and method of operation are provided that allow for the use of a negative back-gate bias voltage during burn-in operations but provide for the connection of the substrate to ground potential during normal operations. In this manner, latch up is prevented during burn-in operations when the circuit is especially susceptible to these destructive conditions. During normal operations, the grounded substrate allows for the most efficient operation of the circuit.

One added benefit of providing a negative back-gate bias voltage is that the process enhances quiescent drain current testing. Quiescent drain current testing is performed by first measuring the leakage current through a device in its off state. The device is then stressed typically by providing high supply voltages similar to burn-in conditions. The quiescent drain current is then tested again to see if a change has occurred. If a measurable change occurs in quiescent drain current, something within the device has broken down. In order for quiescent drain current testing to be effective, the change in quiescent drain current must be measurable. As active devices within integrated circuits have become smaller and smaller, leakage currents have increased. This has made the change in quiescent drain current difficult to measure. The application of a negative back-gate bias voltage reduces the magnitude of the leakage current. As such, the use of a negative back-gate bias voltage can aid in quiescent drain current testing because the change in quiescent drain current as a proportion of the magnitude of the quiescent drain current is increased.

Although the present invention has been described in detail, it should be understood that various changes, modifications, and alterations to the teachings described herein may be made without departing from the scope and spirit of the present invention which is solely defined by the appended claims.

What is claimed is:

1. A method of forming an integrated circuit on an outer surface of a semiconductor substrate comprising the steps of:

forming a p-well region in the outer surface of the substrate;

forming an n-channel field effect transistor in the p-well region;

forming a substrate contact electrically connected to the substrate and the p-well region;

applying an elevated supply voltage to a gate conductor and drain region of the n-channel transistor during a burn-in operation;

applying a negative back-gate bias voltage to the substrate contact simultaneously with the application of the elevated supply voltage during burn-in operation to prevent latch up conditions during the burn-in operation;

applying a conventional supply voltage to the gate and drain of the n-channel transistor during normal operations of the integrated circuit; and electrically connecting the substrate to ground potential using the substrate contact simultaneously with the application of the conventional supply voltage during normal operations of the integrated circuit, the elevated supply voltage being greater than the conventional supply voltage.

2. The method of claim 1 wherein the step of forming a substrate contact comprises the step of forming a p-type diffused guard ring region around the periphery of the p-well region.

3. The method of claim 1 wherein the step of forming a substrate contact comprises the step of forming a scribe seal region around the periphery of the semiconductor substrate, the semiconductor substrate comprising a sufficiently low resistivity such that electrical contact to the scribe seal region around the periphery of the substrate provides sufficient electrical contact to the entirety of the substrate.

4. The method of claim 1 and further comprising the steps of:
   forming a ground potential bond pad;
   forming a back-gate bias bond pad;
   connecting the ground potential back bond pad to the source of the n-channel field effect transistor;
   connecting the back-gate bias bond pad to the substrate contact region;
   connecting the back-gate bias bond pad to a first external pin of a semiconductor package housing the integrated circuit;
   connecting the ground potential bond pad to a second external pin of the integrated circuit package housing the integrated circuit;
   electrically connecting the first and second external pins during normal operation of the device; and
   connecting the first external pin to a negative back-gate bias voltage during burn-in operations of the device.

5. The method of claim 1, wherein the step of forming a substrate contact includes forming a substrate contract region within the p-well region by doping with additional p-type impurities.

6. The method of claim 1, wherein:
   the step of forming an n-channel field effect transistor in the p-well region includes forming a plurality of n-channel field effect transistors in the p-well region; and
   the step of forming a substrate contact includes forming a plurality of substrate contract regions within the p-well region by doping with additional p-type impurities, the substrate contact regions disposed within the p-well whereby none of the plurality of n-channel field effect transistors is more than about 10 to 15 microns from a substrate contact region.

7. The method of claim 1, further comprising the steps of:
   following the step of forming a substrate contact and before the step of applying the elevated supply voltage to a gate conductor and drain region of the n-channel transistor, performing a first measurement of quiescent drain current of the integrated circuit simultaneously with applying the negative back-gate bias voltage to the substrate contact;
   following the step of applying the elevated supply voltage to a gate conductor and drain region of the n-channel transistor, performing a second measurement of quiescent drain current of the integrated circuit simultaneously with applying the negative back-gate bias voltage to the substrate contact;
   comparing the first measurement of quiescent drain current with the second measurement of quiescent drain current; and
   determining the integrated circuit as broken if the first measurement of quiescent drain current differs measurably from the second measurement of quiescent drain current.

* * * * *